United States Patent [19]
Song

[11] Patent Number: 5,757,058
[45] Date of Patent: May 26, 1998

[54] PAD FOR PROVIDING ELECTRICAL CONNECTION TO A LIQUID CRYSTAL DISPLAY DEVICE

[75] Inventor: In Duk Song, Kyungki-do, Rep. of Korea

[73] Assignee: LG Electronics Inc., Seoul, Rep. of Korea

[21] Appl. No.: 878,098

[22] Filed: Jun. 18, 1997

Related U.S. Application Data

[63] Continuation of Ser. No. 540,167, Oct. 6, 1995, abandoned.

[30] Foreign Application Priority Data

Jul. 19, 1995 [KR] Rep. of Korea ............. 1995/20376

[51] Int. Cl.$^6$ ............. H01L 31/00; H01L 29/04; H01L 23/48
[52] U.S. Cl. ............. 257/449; 257/59; 257/72; 257/459; 257/749
[58] Field of Search ............. 257/431.7, 459, 257/750, 749, 59, 72, 448, 9

[56] References Cited

U.S. PATENT DOCUMENTS

| | | | |
|---|---|---|---|
| 4,651,185 | 3/1987 | Holmberg et al. | 257/59 |
| 4,828,370 | 5/1989 | Suzuki | 350/339 R |
| 5,146,301 | 9/1992 | Yamamura et al. | 257/431 |
| 5,187,604 | 2/1993 | Taniguchi et al. | 359/88 |
| 5,289,300 | 2/1994 | Yamazaki et al. | 359/51 |
| 5,389,812 | 2/1995 | Huber et al. | 257/459 |

FOREIGN PATENT DOCUMENTS

| | | | |
|---|---|---|---|
| 63-136578 | 6/1988 | Japan | 257/59 |
| 115781 | 6/1989 | Japan | 257/459 |
| 988075 | 4/1965 | United Kingdom | 257/738 |

*Primary Examiner*—Teresa M. Arroyo
*Attorney, Agent, or Firm*—Finnegan, Henderson, Farabow, Garrett & Dunner, L.L.P.

[57] ABSTRACT

A pad for providing an electrical connection to a liquid crystal display (LCD) includes a first indium tin oxide (ITO) layer provided on a surface of an insulative substrate. At least one metal layer is provided on the first ITO layer and a second ITO layer, in turn, is disposed on the metal layer so that the metal layer is effectively embedded in ITO material. The metal layer is thus shielded from humidity effects and the resulting pad has improved conductivity and reduced signal propagation delay. A recessed portion may be provided in a top surface of the pad so that a spherical conductor spreading during a subsequent bonding process is prevented. The metal layer may be fabricated in the same step that the gate layer of a TFT is formed, and the second ITO layer may be formed concurrently with a pixel electrode of the LCD.

15 Claims, 6 Drawing Sheets

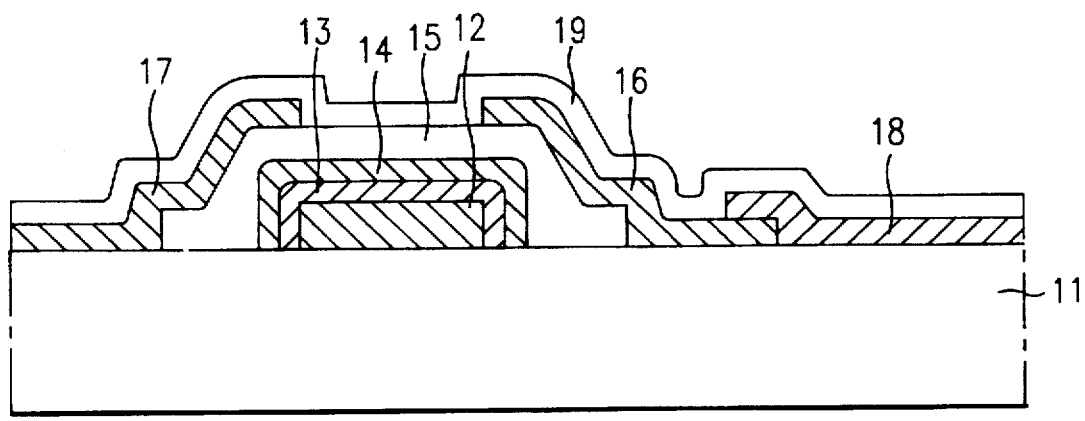
F. I G. 2
prior art

PAD FOR PROVIDING ELECTRICAL CONNECTION TO A LIQUID CRYSTAL DISPLAY DEVICE

This application is a continuation of application Ser. No. 08/540,167, filed Oct. 6, 1995, now abandoned.

BACKGROUND OF THE INVENTION

1. Field Of The Invention

The present invention relates to a liquid crystal display (hereinafter "LCD") device, and more particularly to a pad structure for incorporation in an LCD to improve reliability and conductivity.

2. Description Of The Prior Art

FIG. 2 illustrates a cross-sectional view of a conventional thin film transistor (TFT) which may be incorporated into an LCD. The conventional thin film transistor includes a substrate 11 on which a metal layer patterned to form gate electrode 12. Insulating layers 13 and 14, constituting a double-layered structure, are provided on gate electrode 12. A semiconductor layer 15 is then formed on the double layer insulative structure with source and drain electrodes, 16 and 17, respectively formed on opposite sides thereof, but not extending entirely over the top surface of gate electrode 12.

A transparent conductive layer is provided over the entire surface of the substrate and is patterned to form pixel electrode 18. As shown in FIG. 2, pixel electrode 18 is coupled to source electrode 16. Lastly, a passivation layer 19 is deposited over the exposed surfaces of the electrodes and semiconductor layer 15, thereby completing the TFT structure.

FIG. 1 illustrates a conventional lay out of pad electrodes 20 and TFT gate electrodes 12 on the surface of substrate 11. As seen in FIG. 1, selected pads 20 are coupled to respective gate electrodes 12 of plural TFTs of the structure shown in FIG. 1. Pads 20 are preferably formed during fabrication of the TFTs.

A conventional pad structure 20 is described in U.S. Pat. No. 5,146,301 and is illustrated in FIG. 3A. This pad structure includes a pad-forming metal layer 12' and a transparent conductive layer 18' provided on one another as shown in FIG. 3A. Pad forming metal layers 12' and transparent conductive layers 18' are deposited and patterned along with gate electrodes 12 and pixel electrodes 18 of the TFTs. The resulting pad structure shown in FIG. 3A includes layers 12' and 18' having the same width.

An alternative conventional pad structure is illustrated in FIG. 3B, wherein the transparent conductive layer 18' covers the top surface as well as side surfaces of metal layer 12'. This pad structure is described in further detail in U.S. Pat. No. 5,187,604.

In the above described pad structures, however, metal layer 12' is typically etched along with the TTF gate electrodes with a metal etching solution. Frequently, a portion of the glass substrate adjacent the metal layer can also be etched by the metal etching solution. In which case, portions of the metal layer can be exposed to moisture, thereby forming an oxide which reduces the conductivity of the pad.

Further, side surfaces of the metal layer 12' in the pad structure shown in FIG. 3A are susceptible to oxidation during deposition of the transparent conductive layer 18' (typically indium tin oxide or ITO). Such oxidation can render metal layer 12' nonconductive and prevent application of an external signal to the LCD. In addition, during subsequent reliability tests, the side surfaces of metal layer 12' in FIG. 3A are exposed to moisture, particularly during humidity tests. The moisture can cause metal layer 12' to erode, resulting in a disconnection or a delay in a signal supplied from a driving IC to the LCD.

Moreover, the pad is typically bonded to a tape carrier package (TCP) containing LCD driver IC circuits by an anisotropic conductive layer (ACF), which includes conductive spheres in an insulative medium. During the bonding process, also referred to a TAB or tape automated bonding, the ACF is sandwiched between the pad and the TCP. If the top surface of the pad is smooth or rounded, it is difficult to bond the conductive spheres to the pad, resulting in a poor contact which can delay signals supplied to the LCD.

SUMMARY OF THE INVENTION

The present invention is directed to solving the above-described problems. Accordingly, it is an object of the present invention to provide a pad for use in an LCD and related fabrication method thereof having improved reliability against humidity and increased conductivity when bonded with ACF conductive spheres.

An additional object of the present invention is to provide a suitable conductive pad for an LCD when portions of the pad-forming metal is oxidized.

A further object of the present invention is to provide a pad of a liquid crystal display device which can maintain adequate electrical contact when the conductive spheres of the ACF are pressed against the top surface of the pad.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve these objects in accordance with the purpose of the invention, as embodied and broadly described herein, an electrical contact is provided which comprises a first layer of electrically conductive material and a second layer of electrically conductive material. The second layer of electrically conductive material is transparent. The first conductive layer is embedded in said first layer.

Further in accordance with the present invention, a method is provided for fabricating a pad for making an electrical connection to a liquid crystal display device including a first electrode, a data supplying second electrode, and a pixel-driving third electrode. Specifically, the method comprises a first step of forming a first conductive layer having a first width on a substrate, the first conductive layer is substantially transparent. In a second step, a metal layer is deposited over first and second portions of the substrate and patterned to form the first electrode over the first portion of the substrate and a first metal layer having a second width over the second portion of the substrate. The first metal layer being interposed between the second portion of the substrate and the first metal layer.

A conductive material is then deposited on the substrate; the conductive material is substantially transparent. The conductive material is then patterned to form the third electrode over the first portion of the substrate and a second conductive layer over the second portion of the substrate. The second conductive layer has a third width sufficient to entirely cover the metal layer so that the metal layer is embedded between the first and second conductive layers.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE DRAWINGS

FIG. 2 is a cross-sectional view of a conventional thin film transistor;

DETAILED DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

In accordance with present invention, the metal layer of a conductive pad is preferably embedded in a transparent conductive material for an LCD, such as indium tin oxide (ITO), formed on the surface of an insulative substrate. With this pad structure, the metal layer is shielded from moisture and remains highly conductive and reliable even in severe humidity conditions.

The pad is preferably formed on the surface of an insulative substrate by providing a first transparent conductive layer, i.e., one that is transmissive to visible light. At least one metal layer is then provided on the first transparent conductive layer where the metal layer has an area less than the area of the first transparent conductive layer. Lastly, a second transparent conductive layer is formed on the metal layer having an area greater than the area of the metal layer so as to completely cover the metal layer. In the resulting structure, the metal layer is embedded (wrapped) entirely in the transparent conductive material.

Further, in accordance with another feature of the present invention, a recessed portion is provided in the top pad surface, which prevents conductive spheres from spreading on the top surface of the pad during TAB. A reliable pad with low resistance is thus obtained.

Preferably, the pad is formed on the same substrate as the TFTs of the LCD and includes conductive layers which are formed simultaneously with various TFT electrode structures. For example, the metal layer of the pad may be formed simultaneously with the gates of the TFTs and the second transparent conductive layer may be formed along with the pixel electrodes.

Figure 1:
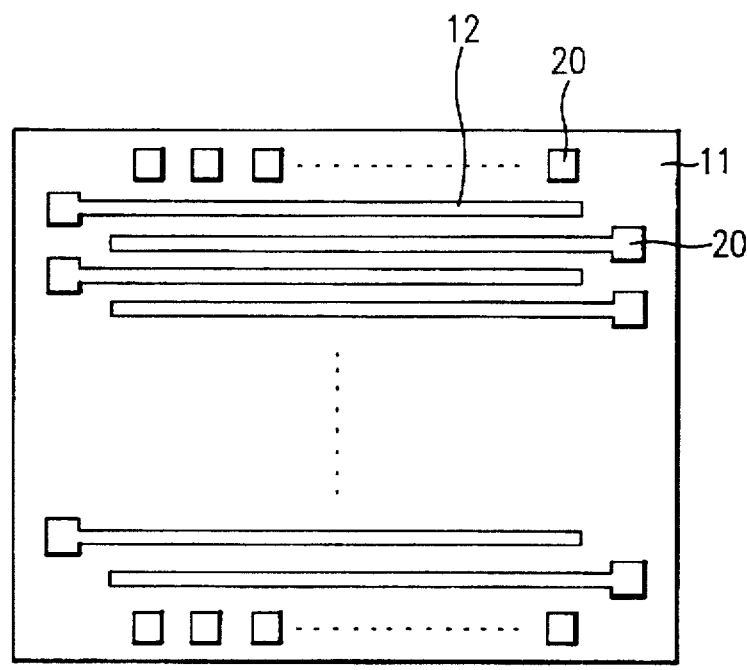
FIG. 1 shows a plan view of a conventional LCD.
Figure 3A:
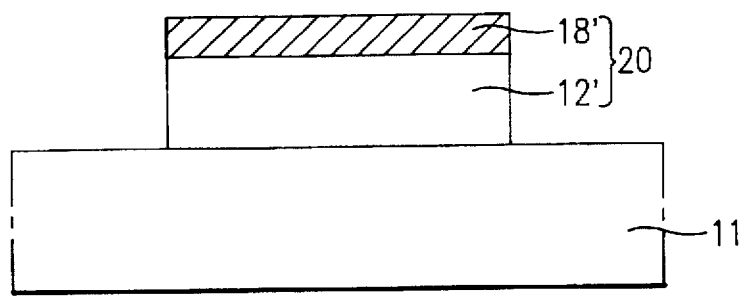
FIG. 3A is cross-sectional view of a conventional pad for incorporation in an LCD.
Figure 3B:
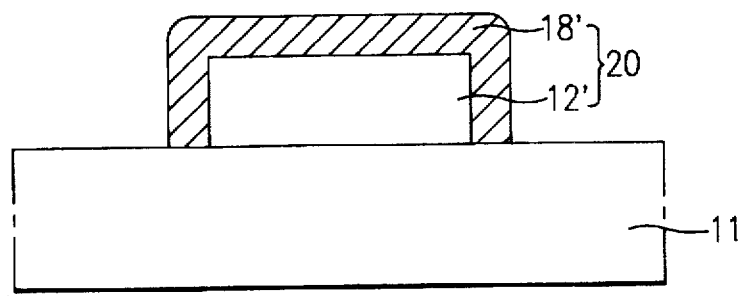
FIG. 3B is a cross-sectional view of an alternative conventional pad for incorporation in an LCD.
Figure 4:
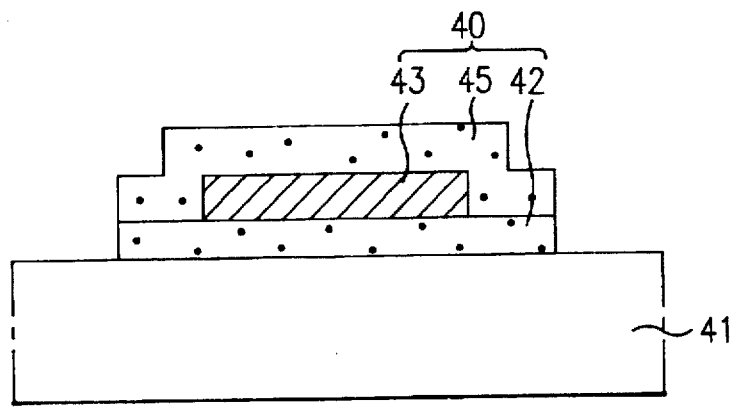
FIG. 4 is a cross-sectional view of a pad in accordance with a first embodiment of the present invention.

Referring to FIG. 4, a first embodiment of the present invention will now be described. An LCD pad 40 includes a first transparent conductive layer 42 provided on an insulative substrate 41. A single layer of metal 43 is provided on first transparent conductive layer 42, preferably made of ITO. Metal layer 48 is narrower than first transparent conductive layer 42. A second transparent conductive layer 45, preferably ITO, is disposed on metal layer 43. The width of the second transparent conductive layer 45 is preferably greater than the width of the metal layer so that the second transparent conductive layer 45 completely covers metal layer 43. In the pad structure shown in FIG. 4, metal layer 43 is effectively embedded in the transparent conductive material of layers 42 and 45.

A method for forming the device shown in FIG. 4 will now be described. Prior to forming the gates of the TFTs, a layer of ITO is deposited on substrate 41 and patterned photolithographically to form first transparent conductive layer 42. Then, in the same step that the gate of the TFT is formed, a metal such as aluminum, aluminum tantalum, or molybdenum, is preferably sputtered onto the surface of the substrate and patterned, preferably using a wet etch, to form metal layer 43. Accordingly, metal layer 43 consists of the same metal as the gate of the TFT. Lastly, during the step in which the pixel electrode is formed, a second layer of ITO is deposited and patterned to form second conductive layer 45.

Figure 5:
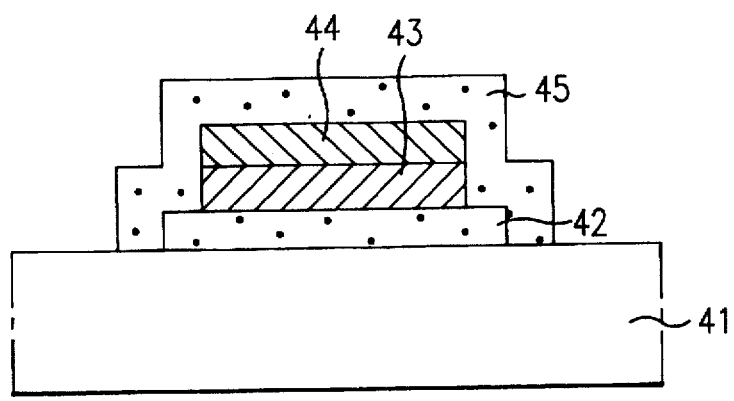
FIG. 5 is a cross-sectional view of a pad in accordance with a second embodiment of the present invention.

As shown in FIG. 5, a pad structure 40 in accordance with a second embodiment of the present invention is similar to the first embodiment, with the exception that an additional layer 44, preferably including metal and having a width less than or equal to metal layer 43, is provided on metal layer 43. The second transparent conductive layer 45, in turn, is disposed on metal layers 43 and 44 and has a width sufficient to cover both of these layers. Accordingly, both layers 43 and 44 are embedded in the transparent conductive material of layers 42 and 45. In this embodiment conductive layer 44 is included to provide redundancy.

A method for fabricating the pad structure shown in FIG. 5 is similar to that discussed above with reference to FIG. 4. However, after metal layer 43 is deposited during the gate forming process, the metal layer 44 is formed along with the source and drain electrodes of the TFT and preferably consists of the same material as these electrodes. Namely, metal layer 44 is preferably formed by depositing source/drain electrode metal and patterning using a wet etch.

A pad structure 40 in accordance with a third embodiment of the present invention will now be described with reference to FIG. 6. In this embodiment, the second electrode layer 44 is provided as two separate layers 44a and 44b on the opposed sides of metal layer 43. Preferably, layers 44a and 44b cover respective side surfaces of metal layer 43 and extend over respective portions of the top surface of metal layer 43. The second transparent conductive layer 45', in turn, is deposited to cover the exposed surfaces of each of layers 43, 44a and 44b. The resulting structure has a recessed portion 50, which prevents spreading of conductive spheres in the ACF during the bonding process.

Figure 7:
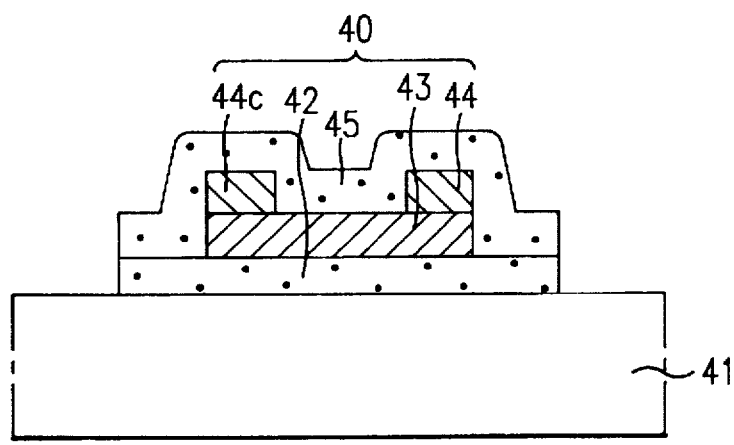
FIG. 7 is a cross-sectional view of a pad in accordance with a fourth embodiment of the present invention.

A pad structure in accordance with the fourth embodiment is illustrated in FIG. 7. The fourth embodiment is similar to the third embodiment in that it includes first and second transparent conductive layers 42 and 45, and metal layers 43 and 44. In this embodiment, as in each of the above described embodiments, metal layer 43 is narrower than first and second conductive layers 42 and 45. The metal layer 44 in this embodiment, however, is provided as spaced layers 44c and 44d only on the top surface of metal layer 43. As further shown in FIG. 7, layers 44c and 44d are disposed adjacent side edges of the top surface of metal layer 43.

Figure 8:
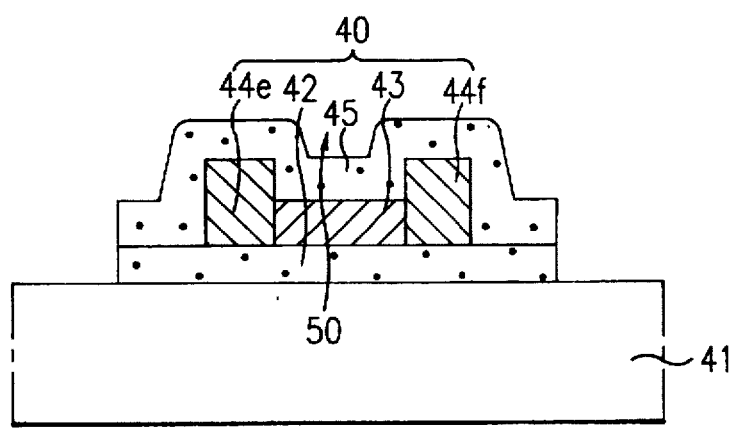
FIG. 8 is a cross-sectional view of a pad in accordance with a fifth embodiment of the present invention.

The pad structure 40 in accordance with a fifth embodiment of the present invention is similar to that of the fourth embodiment. As shown in FIG. 8, however, electrode layers 44e and 44f are provided adjacent respective side surfaces of metal layer 43 and do not overly the top surface thereof. Preferably, a sum of the widths of electrodes layers 44e and 44f and metal layer 43 is less than the width of second transparent conductive layer 45.

Figure 6:
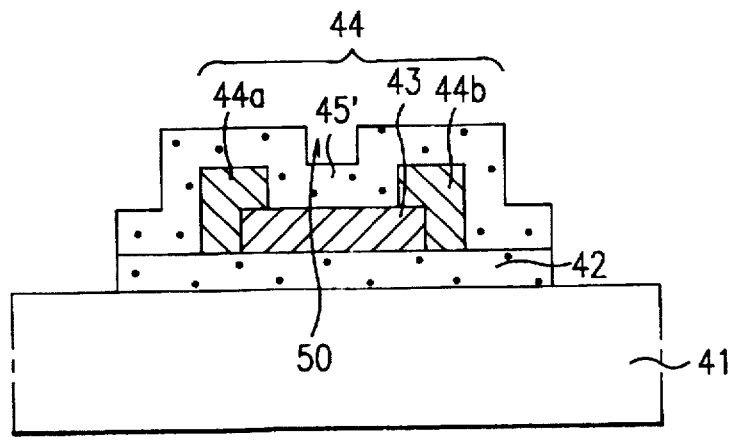
FIG. 6 is a cross-sectional view of a pad in accordance with a third embodiment of the present invention.

The pads illustrated in FIG. 6–8 are formed in substantially the same fashion as the pad shown in FIG. 5. That is, metal layers 44 are formed in the same step as the source and drain electrodes of the TFTs. In FIGS. 6–8, however, the metal layers are patterned differently in order to obtain the structures illustrated in these drawings.

In each of the embodiments illustrated in FIGS. 6–8, a recessed portion 50 is provided in a substantially central location at the top surface of the pad 40. This recessed portion prevents spreading of the conductive spheres or balls in the ACF. A proper electrical connection can thus be obtained having improved reliability as well as high conductivity.

Figure 9:
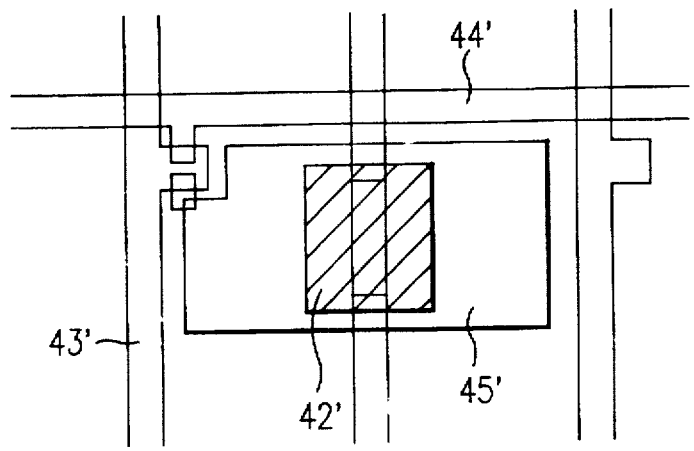
FIG. 9 is a plan view of a pixel.
Figure 11:
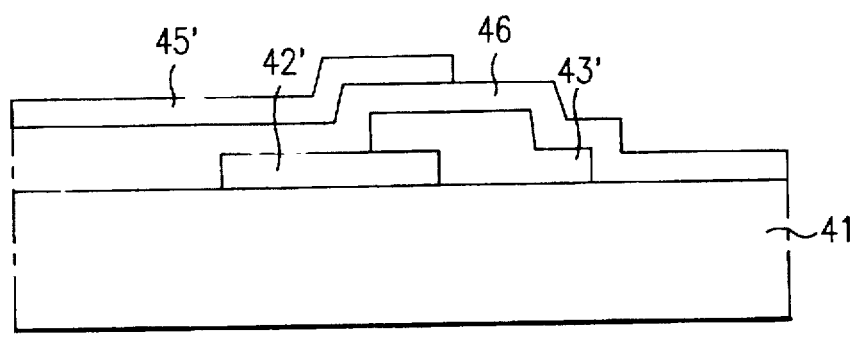
FIG. 11 is a cross-sectional view taken along line A–A' in FIG. 10.

FIG. 9 illustrates a plan view of a pixel having a storage capacitor which can be used in conjunction with the above described pad structure. As shown in FIG. 9, gate electrode wiring 43' and data wiring 44' couple signals to the TFTs. A first transparent conductive layer 42', which is also formed at the pad location layer, is provided beneath a pixel electrode 45'. An insulating layer, such as illustrated at 46 in FIG. 11, is sandwiched between conductive layer 42' and pixel electrode 45'. The resulting storage capacitor has increased area, and, thus, a relatively high capacitance.

Figure 10:
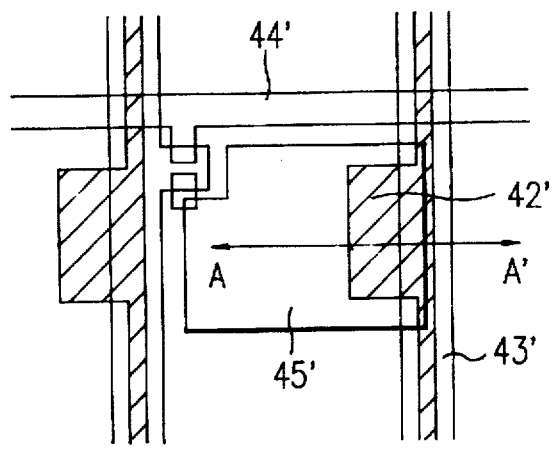
FIG. 10 is a plan view of an alternative TFT.

FIG. 10 illustrate a pixel in which the above-described pad structure is used, while FIG. 11 shows a cross-sectional view of this device. As shown in these figures, an insulating layer 46 is sandwiched between a first transparent conductive layer 42' and a second transparent conductive layer 45, which, in this portion of the LCD, constitutes a pixel electrode. First conductive layer 42' (which is also used in the pad) is partially under by the gate electrode wiring 43' and thus serves as redundant gate wiring, thereby reducing the electrical resistance thereof.

The above described device structures in which the first transparent conducive layer is used both in the pad and in the TFT, we so have an increased aspect ratio and therefore reduce power consumption.

As noted above, the pad in accordance with the present invention includes a metal layer enclosed or embedded entirely within transparent conductive material so that it is not affected by humidity, which would otherwise cause the metal layer either a break in the electrical continuity or delay a signal supplied from a driving IC. Reliability is thus improved.

Further, a substantially central portion of a top surface of the pad is recessed to prevent spreading of the conductive spheres or balls in the ACF. Accordingly, signal delay is further minimized.

Moreover, even though the pad forming metal layer may be oxidized somewhat during the steps of depositing the transparent conductive layer, such oxidation does not significantly increase the resistance of the pad. This is because the metal layer is embedded between the ITO layers, which are themselves conductive. The integrity of the pad is thus maintained and electrical discontinuity or signal delay is prevented.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An electrical contact comprising:
   a first layer of electrically conductive material; and
   a second layer of electrically conductive material, said second layer of electrically conductive material being transparent,
   wherein said first layer of electrically conductive material is embedded entirely within said second layer.

2. An electrical contact in accordance with claim 1, wherein said second layer of electrically conductive material further comprises:
   a first conductive sublayer on the substrate; and
   a second conductive sublayer disposed on said first conductive sublayer.

3. An electrical contact in accordance with 1, wherein said first conductive sublayer has a top surface and first and second side surfaces, said second conductive sublayer includes first and second portions, said first portion of said second conductive sublayer covering at least a part of said first side surface and a first portion of said top surface of said first conductive sublayer, and said second portion of said second conductive sublayer covering at least a part of said second side surface and a second portion of said top surface of said first conductive sublayer.

4. An electrical contact in accordance with 1, wherein said first conductive sublayer has a top surface, said second conductive sublayer includes first and second portions, said first portion of said second conductive sublayer covering a first portion of said top surface of said first conductive sublayer, and said second portion of said second conductive sublayer covering a second portion of said top surface of said first conductive sublayer.

5. An electrical contact in accordance with 1, wherein said first conductive sublayer has first and second side surfaces, said second conductive sublayer includes first and second portions, said first portion of said second conductive sublayer covering at least a part of said first side surface, and said second portion of said second conductive sublayer covering at least a part of said second side surface.

6. An electrical contact comprising:
   a substrate;
   a first layer of electrically conductive material; and
   a second layer of electrically conductive material provided on said substrate to entirely embed said first layer of electrically conductive material within said second layer, said second layer of electrically conductive material including a recessed portion adapted to receive a substantially round electrical conductor.

7. A pad for providing electrical contact to a liquid crystal display device, said pad comprising:
   a first conductive layer having a first width, said first conductive layer being transparent;
   a second conductive layer including a metal, said second conductive layer having a second width and being formed on said first conductive layer; and a third conductive layer having a third width, said third conductive layer being transparent to visible electromagnetic radiation and being formed in contact with an upper portion of said second conductive layer and an edge portion of said first conductive layer.

8. A pad in accordance with claim 7, wherein said second width is less than said first width.

9. A pad in accordance with claim 7, wherein said third width is at least equal to said first width.

10. A pad for providing electrical contact to a liquid crystal display device comprising:

a first conductive layer being transparent and having a first width;

a second conductive layer including a metal and having a second width less than said first width, said second conductive layer being formed on said first conductive layer; and a third conductive layer being transparent and having a third width at least equal to said first width, said third conductive layer formed in contact with an edge portion of said first conductive layer and an upper portion of said second conductive layer, wherein said second conductive layer is embedded between said first and third conductive layers.

11. A pad for providing electrical connection to a liquid crystal display device comprising:

a first conductive layer being transparent and having a first width;

a second conductive layer including a metal and having a second width less than said first width, said second conductive layer being formed on said first conductive layer;

a third conductive layer including a second metal and having a third width, said third conductive layer being formed on said second conductive layer, said second width being at least equal to said third width; and a fourth conductive layer being transparent and having a fourth width at least equal to said first width, said fourth conductive layer formed in contact with an upper portion of said third conductive layer and an edge portion of said first conductive layer, wherein said second and third conductive layers are embedded between said first and fourth conductive layers.

12. A pad for providing electrical connection to a liquid crystal display device comprising:

a first conductive layer being transparent and having a first width;

a second conductive layer including a first metal and having a second width less than said first width, said second conductive layer being formed on said first conductive layer, said second conductive layer including a first edge portion and a second edge portion;

a third conductive layer including a second metal and having a first edge portion and a second edge portion; and a fourth conductive layer being transparent to electromagnetic radiation and having a third width at least equal to said first width, said fourth conductive layer covering said first and second conductive layers and said first and second parts of said third conductive layer.

13. A pad for providing electrical connection to a liquid crystal display device comprising:

a first conductive layer being transparent and having a first width;

a second conductive layer including a first metal and having a second width less than said first width, said second conductive layer being formed on said first conductive layer, said second conductive layer including a first edge portion and a second edge portion;

a third conductive layer including a second metal, and having a first edge portion and a second edge portion; and a fourth conductive layer being transparent and having a third width at least equal to said first width, said fourth conductive layer covering said first and second conductive layers.

14. A pad for providing electrical connection to a liquid crystal display device comprising:

a first conductive layer being transparent and having a first width;

a second conductive layer including a first metal and having a second width less than said first width, said second conductive layer being formed on said first conductive layer, said second conductive layer including a first side surface and a second side surface;

a third conductive layer including a second metal and having a first part provided on said first side surface and a second part provided on said second side surface, said first and second parts having widths less than said second width; and a fourth conductive layer being transparent to radiation and having a third width at least equal to said first width, said fourth conductive layer covering said first and second conductive layers and said first and second parts of said third conductive layers.

15. A pad in accordance with claim 14, wherein said third width is greater than a sum of said second width and said widths of said first and second parts of said third conductive layer.

* * * * *

UNITED STATES PATENT AND TRADEMARK OFFICE
CERTIFICATE OF CORRECTION

PATENT NO. :
DATED       : 5,757,058
INVENTOR(S) : May 26, 1998
              SONG

It is certified that error appears in the above-identified patent and that said Letters Patent is hereby corrected as shown below:

Claim 3, column 6, line 26, before "1", insert --claim--.

Claim 4, column 6, line 36, before "1", insert --claim--.

Claim 5, column 6, line 44, before "1", insert --claim--.

Claim 6, column 6, line 53, "material:" should read --material;--.

Signed and Sealed this

First Day of June, 1999

*Attest:*

Q. TODD DICKINSON

*Attesting Officer*     *Acting Commissioner of Patents and Trademarks*